United States Patent [19]

Ruwe et al.

[11] 4,133,910

[45] Jan. 9, 1979

[54] THICK FILM DEPOSITION OF MICROELECTRONIC CIRCUIT

[75] Inventors: Victor W. Ruwe, Huntsville; Thomas D. Graben, Woodville, both of Ala.

[73] Assignee: The United States of America as represented by the Secretary of the Army, Washington, D.C.

[21] Appl. No.: 856,438

[22] Filed: Dec. 1, 1977

[51] Int. Cl.$^2$ .......................... B41M 3/08; B05D 5/12
[52] U.S. Cl. ...................................... 427/96; 427/105; 427/231; 427/232; 427/233; 118/7; 118/8; 118/11
[58] Field of Search ................. 427/96, 231, 233, 105, 427/232; 118/7, 8, 11; 358/294, 295

[56] References Cited

U.S. PATENT DOCUMENTS

| | | | |
|---|---|---|---|
| 1,635,027 | 7/1927 | Belin | 358/295 |
| 2,619,430 | 11/1952 | Fink | 427/233 |
| 3,445,262 | 5/1969 | Greck et al. | 427/233 |
| 3,541,248 | 11/1970 | Young | 358/294 |
| 3,697,313 | 10/1972 | Stumphauzer | 427/233 |
| 3,739,095 | 6/1973 | Alden | 358/294 |

*Primary Examiner*—Michael F. Esposito
*Attorney, Agent, or Firm*—Nathan Edelberg; Robert P. Gibson; Harold W. Hilton

[57] ABSTRACT

A process for depositing thick film electronic material which forms electric circuits on the inside wall of right circular substrates. The process includes the determination of a circuit pattern wherein a light sensor is used to actuate electronics which in turn controls the flow of the thick film paste for deposition on the substrate inside wall. The substrate is rotated and translated in conjunction with the movement of a light sensor in the x-y plane.

2 Claims, 3 Drawing Figures

THICK FILM DEPOSITION OF MICROELECTRONIC CIRCUIT

DEDICATORY CLAUSE

The invention described herein may be manufactured, used and licensed by or for the Government for governmental purposes without the payment to us of any royalties thereon.

BACKGROUND OF THE INVENTION

This invention relates to the field of thick film deposition of microelectronic circuits. Fabricating thick film circuits have been devised for use in antitank missiles. However the use of flat substrates in front of a missile warhead required a hole to be left therein which reduced the effectiveness of the warhead. Prior methods employ a screening of the paste on a flat substrate but this is impractical for use in depositing material on the inside of a right circular substrate. No system is known for depositing thick film electronic circuits on the inside of right circular substrates.

SUMMARY OF THE INVENTION

The present invention has provided a practical solution to the above stated problem by placing a material depositing nozzle at a predetermined distance from the inside wall of a right circular substrate. The substrate is then rotated and translated in response to the movement of the light sensor in the $x$-$y$ plane. This light sensor actuates electronics which in turn controls the flow of the film paste for deposition on the substrate inside wall.

This invention may be better understood from the following detailed description taken in conjunction with the accompanying drawing.

DESCRIPTION OF THE PREFERRED EMBODIMENT

Figure 1:
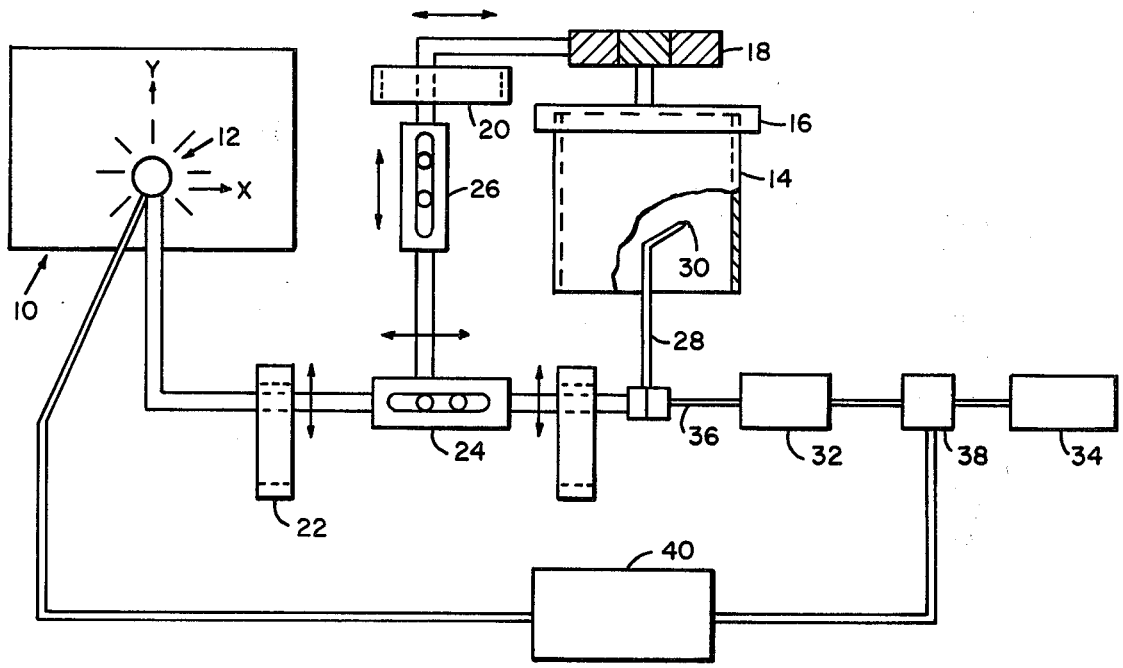
FIG. 1 is a diagram showing the basic elements of the apparatus used to perform the depositing process.
Figure 2:
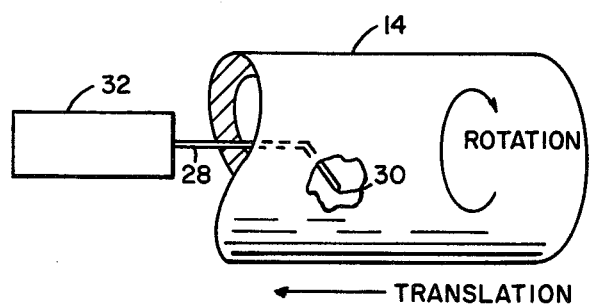
FIG. 2 is a partial view in section of the nozzle inside of the substrate.
Figure 3:
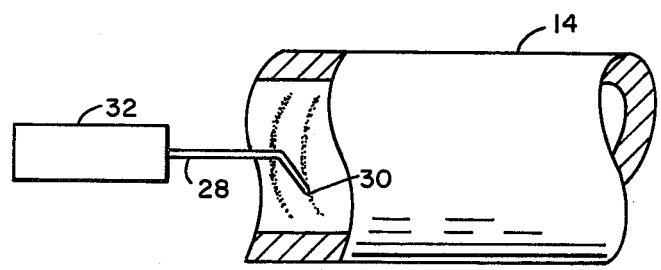
FIG. 3 is a view showing deposition of the film material inside of the substrate.

Referring now to the drawing reference numeral 10 indicates a light table with a circuit pattern thereon and a light point sensor 12. A right circular substrate 14 is held by a holder 16 and is caused to rotate by means 18. As seen in FIG. 1 means 20, 22, 24 and 26 causes means 18 to rotate and translate in response to movement of sensor 12. A nozzle 28 having an orifice 30 is located inside of the substrate. The thick film paste is held in a container 32 and pressurized from a source 34 of nitrogen through a conduit 36 to the nozzle.

In operation as the circular substrate 14 is rotated, the light sensor 12 is translated in the $x$ direction and simultaneously rotated as the deposition orifice is translated through the substrate, the light sensor is moved in the $y$ direction. The pattern permits light to be transmitted to the sensor only if no material is desired. The light sensor controls the pressure on the paste container 32 through a switch 38 controlled by electronics 40.

This process is repeated with different pastes and patterns until a competent circuit is fabricated on the inside of the substrate.

We claim:

1. A process for depositing a thick film electronic material to form an electronic circuit on the inside wall of a right circular substrate, said process comprising:

projecting a light sensor onto a circuit pattern;

moving said light sensor both in an x and y direction;

rotating a right circular substrate in response to the movement of said light sensor;

positioning a depositing nozzle inside of said right circular substrate in close proximity to the inner wall of said substrate;

translating said nozzle in said substrate in response to movement of said light sensor; and actuating control means to cause film material to flow through said nozzle and be deposited on the inside wall of said substrate.

2. A process as set forth in claim 1 further including pressurizing said film material with nitrogen to cause the material to flow.

* * * * *